(12) United States Patent
Bedell et al.

(10) Patent No.: US 9,048,365 B2
(45) Date of Patent: Jun. 2, 2015

(54) TUNABLE LIGHT-EMITTING DIODE

(71) Applicant: International Business Machines Corporation, Armonk, NY (US)

(72) Inventors: Stephen W. Bedell, Wappingers Falls, NY (US); Bahman Hekmatshoartabari, White Plains, NY (US); Devendra K. Sadana, Pleasantville, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/058,944

(22) Filed: Oct. 21, 2013

(65) Prior Publication Data

US 2015/0060760 A1    Mar. 5, 2015

Related U.S. Application Data

(63) Continuation of application No. 14/019,106, filed on Sep. 5, 2013.

(51) Int. Cl.
| H01L 29/06 | (2006.01) |
| H01L 31/00 | (2006.01) |
| H01L 33/06 | (2010.01) |
| H01L 33/32 | (2010.01) |

(52) U.S. Cl.
CPC .............. *H01L 33/06* (2013.01); *H01L 33/32* (2013.01)

(58) Field of Classification Search
CPC ......... H01L 33/04; H01L 33/06; H01L 33/12; H01L 33/0079

USPC ........ 257/13, 405, 406, 410, 411; 438/50, 51, 438/585, 591
See application file for complete search history.

(56) References Cited

U.S. PATENT DOCUMENTS 4,935,935 A    6/1990    Reed et al.
(Continued)

FOREIGN PATENT DOCUMENTS

| EP | 2485283 A1 | 8/2012 |
| WO | 9934484 A2 | 7/1999 |

OTHER PUBLICATIONS

C.H. Chen, et al., "Band gap shift in the GaN/AlN multilayers on the mesh-patterned Si(111)," AIP Applied Physics Letters, vol. 88, 2006, pp. 1-4.

(Continued)

*Primary Examiner* — Zandra Smith
*Assistant Examiner* — John M Parker
(74) *Attorney, Agent, or Firm* — Cantor Colburn LLP; Louis Percello (57) ABSTRACT

A light-emitting diode device includes a base substrate including a plurality of quantum well layers, a first electrode on one side of the plurality of quantum well layers, and a second electrode on an opposite side of the plurality of quantum well layers. The device includes a tensile-stressing layer formed on the base substrate and having a thickness and chemical composition configured to generate a first tensile stress in the base substrate, the first compressive stress selected to cause the base substrate to have a predetermined band-gap.

9 Claims, 7 Drawing Sheets

(56) References Cited

U.S. PATENT DOCUMENTS

| | | |
|---|---|---|
| 6,063,077 A | 5/2000 | Schaer |
| 7,202,506 B1 | 4/2007 | DenBaars et al. |
| 7,550,755 B2 | 6/2009 | Balkenende et al. |
| 7,768,081 B2 | 8/2010 | Balkenende et al. |
| 2003/0012231 A1 | 1/2003 | Tayebati et al. |
| 2006/0220192 A1* | 10/2006 | Kurachi et al. ............... 257/669 |
| 2007/0215855 A1 | 9/2007 | Kang |
| 2010/0307572 A1 | 12/2010 | Bedell et al. |
| 2012/0099614 A1* | 4/2012 | Yamazaki et al. ......... 372/46.01 |

OTHER PUBLICATIONS

D.G. Zhao, et al., "Stress and its effect on optical properties of GaN epilayers grown on Si(111), 6H—SiC(0001), and c-plane sapphire," AIP Applied Physics Letters, vol. 83, No. 4, Jul. 28, 2003, pp. 1-4.

N. Khan, et al., "Effects of Compressive strain on optical properties of $In_xGa_{1-x}N$/GaN quantum wells," Applied Physics Letters, vol. 89, Oct. 2006, pp. 1-3.

* cited by examiner

TUNABLE LIGHT-EMITTING DIODE

CROSS-REFERENCE TO RELATED APPLICATION

The present application is a continuation application of U.S. patent application Ser. No. 14/019,106, filed Sep. 5, 2013. The content of application Ser. No. 14/019,106 is hereby incorporated by reference in its entirety.

BACKGROUND

The present disclosure relates to light-emitting diodes and, in particular, to a tunable light-emitting diode that is tuned by Solid-state lighting technology based on light-emitting diodes (LEDs), such as gallium nitride (GaN) LEDs, is becoming mainstream. GaN may be epitaxially grown on various substrates, such as silicon, silicon carbide, sapphire and GaN. GaN LED's typically consist of GaN contact layers sandwiching multiple quantum-well (MQW) structures, such as indium gallium nitride (InGaN) structures. The wavelength of the LED is adjusted by tuning the energy band of the MQW structure, which is accomplished by adjusting the composition, number and thickness of the InGaN wells.

LED devices may be formed by forming the LED structure on a host substrate and performing a spalling process to separate the LED structure from the host substrate. Substrate spalling induces a fracture in a substrate by applying one or more tensile stressed metal layers to the substrate.

SUMMARY

Embodiments include a method of forming a light-emitting diode including determining a first level of tensile stress to be applied to a base substrate including a plurality of quantum well layers to adjust a band-gap of the base substrate to a predetermined band-gap. The first level of tensile stress is generated in the base substrate by forming a tensile-stressing layer on the base substrate.

Additional embodiments include a light-emitting diode device including a base substrate including a plurality of quantum well layers, a first electrode on one side of the plurality of quantum well layers, and a second electrode on an opposite side of the plurality of quantum well layers. The light-emitting diode device includes a tensile-stressing layer formed on the base substrate and having a thickness and chemical composition configured to generate a first tensile stress in the base substrate, the first tensile stress selected to cause the base substrate to have a predetermined band-gap.

Additional features and advantages are realized through the techniques of the present disclosure. Other embodiments and aspects of the present disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter of the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Conventional light-emitting diode (LED) devices include quantum wells defining a predetermined band-gap that determines a wavelength of light emitted from the LED devices. Once formed, manufacturing processes may degrade characteristics of the LED device and the wavelength emitted by the LED may fall outside a desired range. Embodiments of the invention include a tunable LED device having a tensile-stressing layer to tune a band-gap of the LED device.

Figure 1:
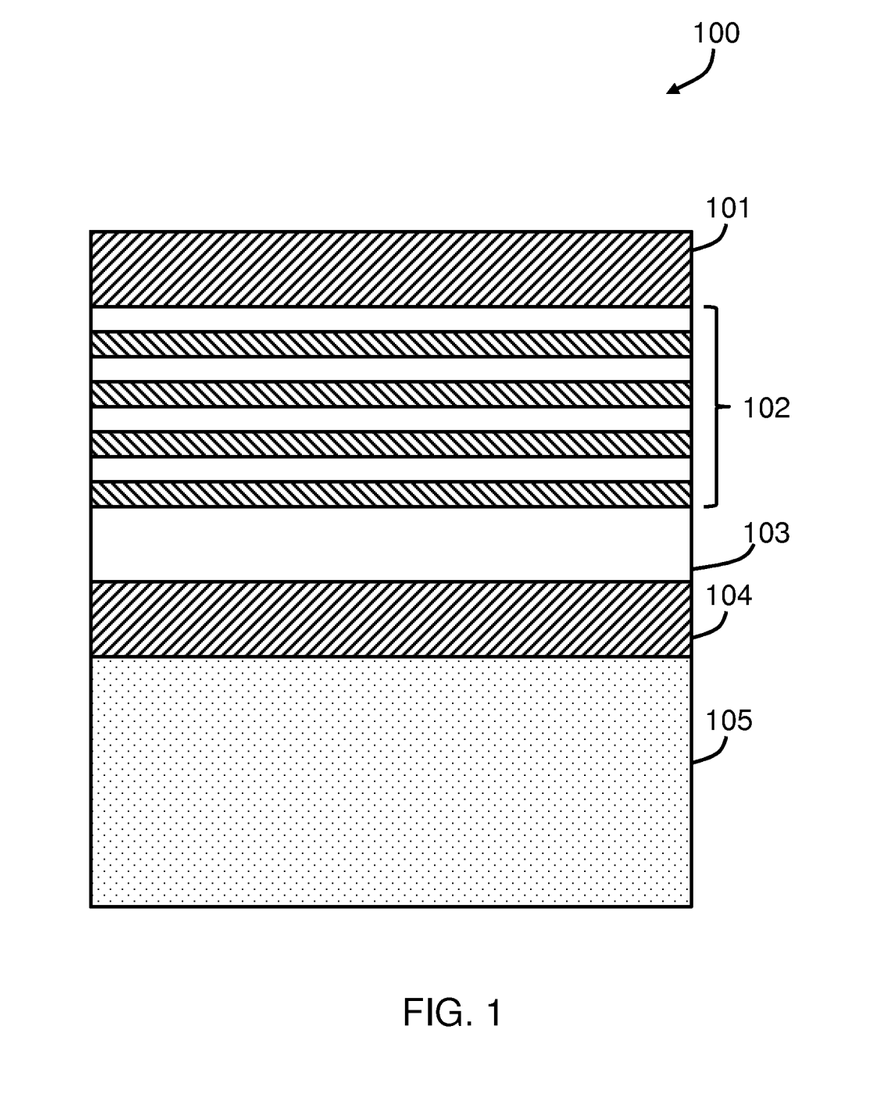
FIG. 1 illustrates a preliminary light-emitting diode (LED) structure according to an embodiment of the invention.

FIG. 1 illustrates a preliminary LED structure 100 according to an embodiment of the invention. The structure 100 includes a host substrate 105, a buffer layer 104, a second electrode layer 103, a plurality of quantum wells 102 and a first electrode layer 101. In one embodiment, the buffer layer is aluminum gallium nitride (AlGaN). The host substrate 105 may be made of any material, and examples of materials that may be used to form the host substrate 105 and the buffer layer 104 include aluminum nitride and gallium nitride.

In one embodiment, the first and second electrode layers 101 and 103 are gallium nitride (GaN) layers. One of the first and second electrode layers 101 and 103 may be a positively-doped gallium nitride layer (p-GaN) and the other of the first and second electrode layers 101 and 103 is a negatively-doped gallium nitride layer (n-GaN).

The plurality of quantum wells 102 includes wide band-gap materials interspersed with narrow band-gap materials. The difference between the band-gaps of the materials defines a barrier height of the plurality of quantum wells 102, or a band-gap of the preliminary LED structure 100 defined by the plurality of quantum wells 102. In embodiments of the invention, the light emitted by the LED structure may be determined by the materials used to form the plurality of quantum wells 102. Examples of materials used to form the quantum wells include indium gallium nitride (InGaN) and gallium nitride (GaN); aluminum gallium nitride (AlGaN) and InGaN; or AlGaN and GaN.

Figure 2:
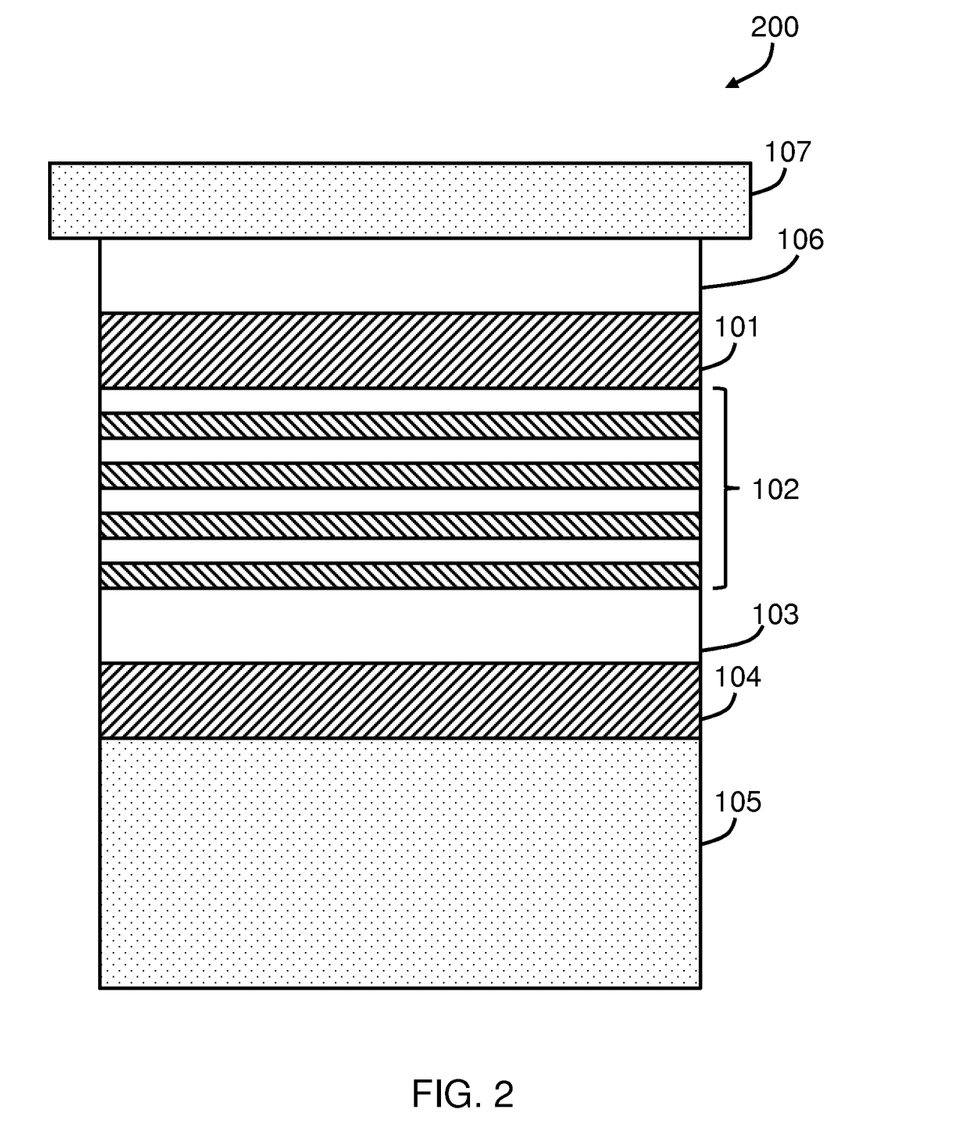
FIG. 2 illustrates a preliminary LED structure according to an embodiment of the invention.

FIG. 2 illustrates a preliminary LED structure 200 formed by adding a tensile-stressing layer 106 to the preliminary LED structure 100 according to an embodiment of the invention. A tensile-stressing layer 106 is formed on the first electrode layer 101, and a flexible handle layer 107 is attached to the tensile-stressing layer 106. In one embodiment, the tensile-stressing layer 106 is a metal layer. Examples of metals that are used to form the tensile-stressing layer 106 include chrome, nickel, and molybdenum. The tensile-stressing layer 106 generates a tensile stress in the preliminary LED structure 100, and in particular in the plurality of quantum wells 102. In one embodiment, the tensile stress is generated by controlling a deposition process of the tensile-stressing layer 106 onto the first electrode 101. In one embodiment, the deposition process is a plasma-enhanced chemical vapor deposition (PECVD) process. In one embodiment, the tensile-stressing layer 106 generates a compressive stress in the plurality of quantum wells 102 to adjust the band-gap or energy band of the plurality of quantum wells 102.

The flexible handle layer 107 may include any type of layer capable of having a force applied to the layer 107 to generate a fracture in the preliminary LED structure 200, such that a portion of the preliminary LED structure 200 breaks away from the host substrate 105. In one embodiment, the flexible handle layer 107 is a layer of tape that adheres to the tensile-stressing layer 106.

Figure 3:
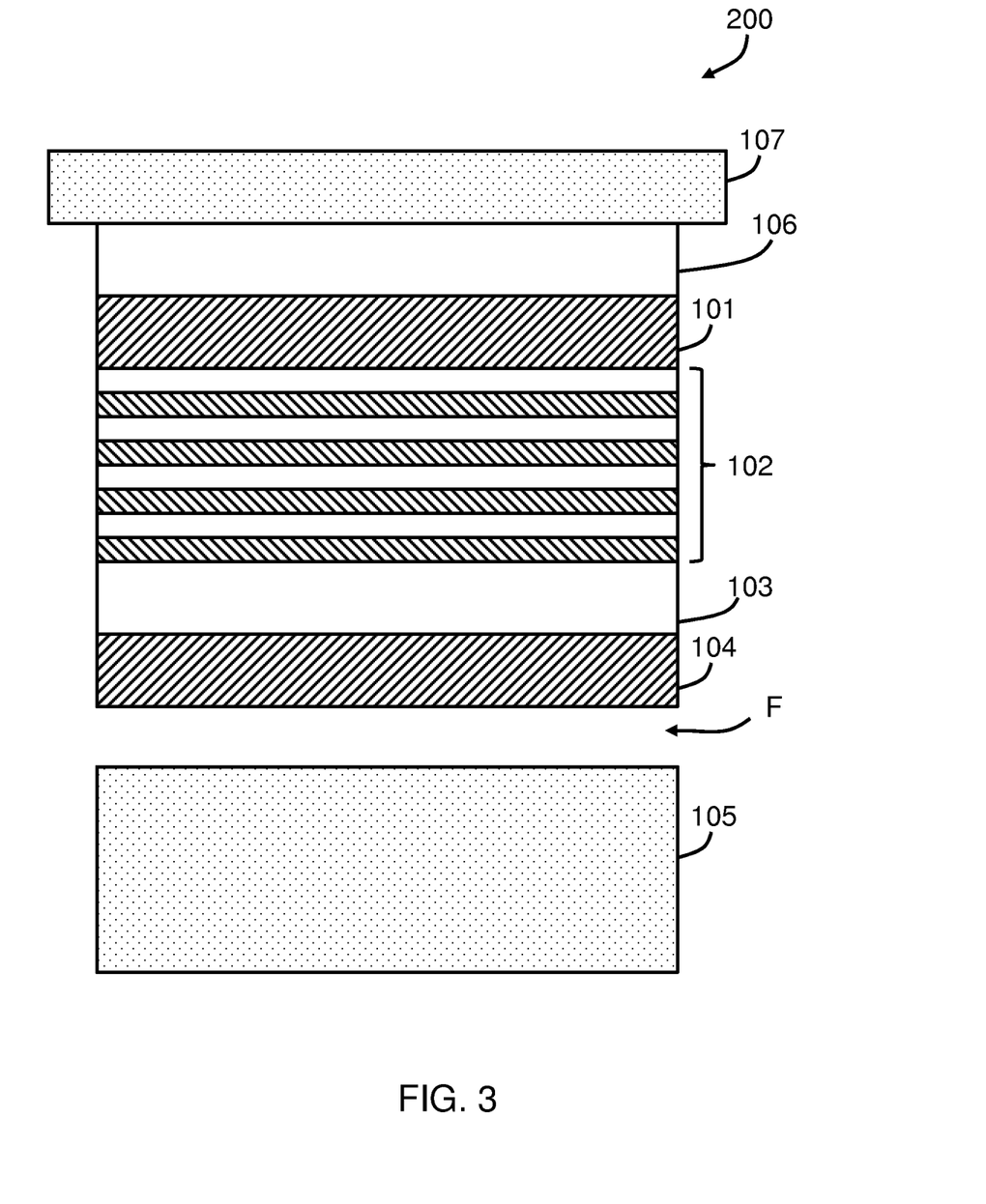
FIG. 3 illustrates a spalling process of a preliminary LED structure according to an embodiment of the invention.

FIG. 3 illustrates a spalling process of the preliminary LED structure 200 according to an embodiment of the invention. In particular, an extrinsic force is applied to the flexible handle layer 107 to generate a fracture F between the host substrate 105 and the buffer layer 104. The location of the fracture F may be determined by the tensile-stressing layer 106. In particular, the tensile-stressing layer 106 may be formed of a certain thickness and a certain chemical composition to induce stress in the preliminary LED structure 200 at a desired location, such as at or near the border between the host substrate 105 and the buffer layer 104. In such a manner, the tensile-stressing layer 106 may serve dual purposes of defining a location of the fracture F in a spalling process and adjusting a band-gap of the plurality of quantum wells 102 to adjust a wavelength of light emitted by the plurality of quantum wells 102.

As illustrated in FIG. 3, the tensile-stressing layer 106 induces a stress that causes the fracture F to propagate across the preliminary LED structure 200, allowing a portion of the preliminary LED structure 200 to transfer from the host substrate 105. The fracture F may be formed substantially parallel to a surface of the preliminary LED structure 200. Separating the electrode layers 101 and 103 and the quantum well layers 102 from the host substrate 105 results in a thin-film preliminary LED structure, such as a structure having a thickness in a range from a few nanometers to tens of micrometers.

Figure 4:
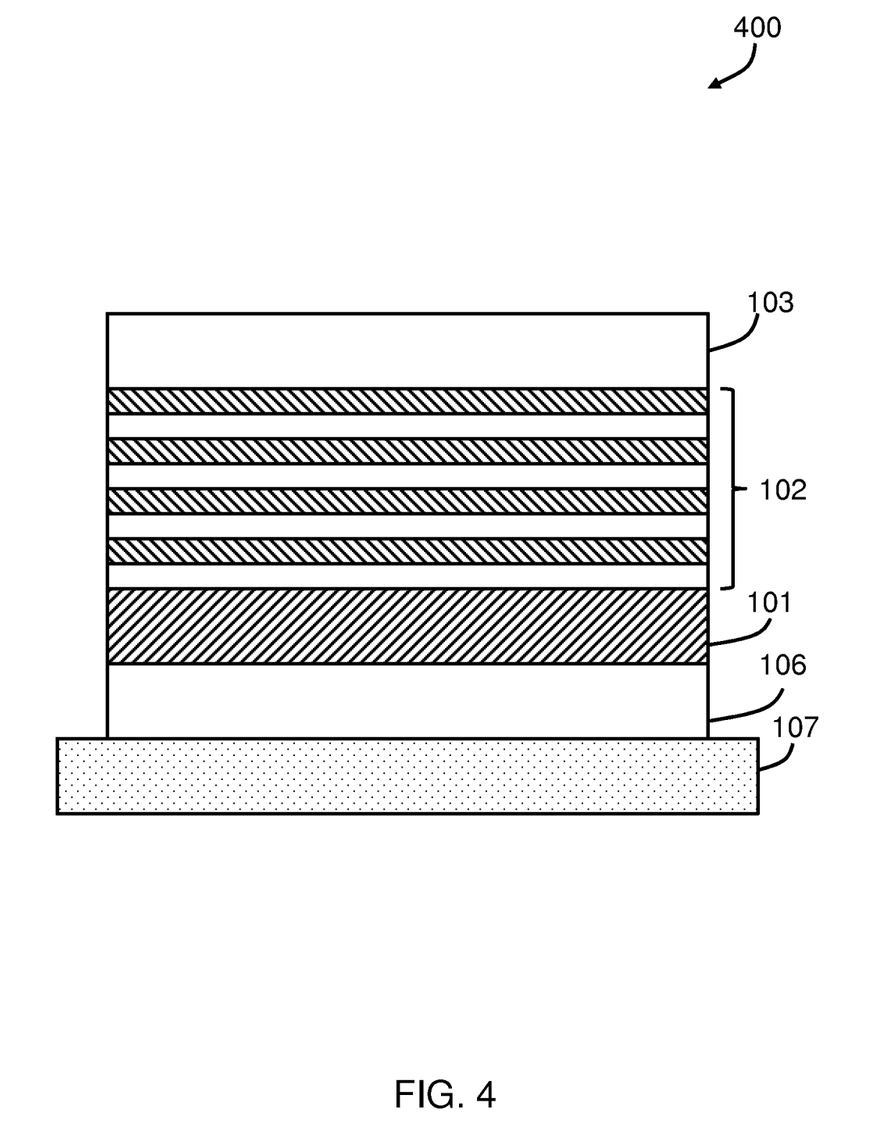
FIG. 4 illustrates a preliminary LED structure according to an embodiment of the invention.

FIG. 4 illustrates the preliminary LED structure 400 resulting from the spalling process illustrated in FIG. 3. The preliminary LED structure 400 includes the flexible handle layer 106, the tensile-stressing layer 106, the first electrode 101, the plurality of quantum wells 102 and the second electrode 103.

Figure 5:
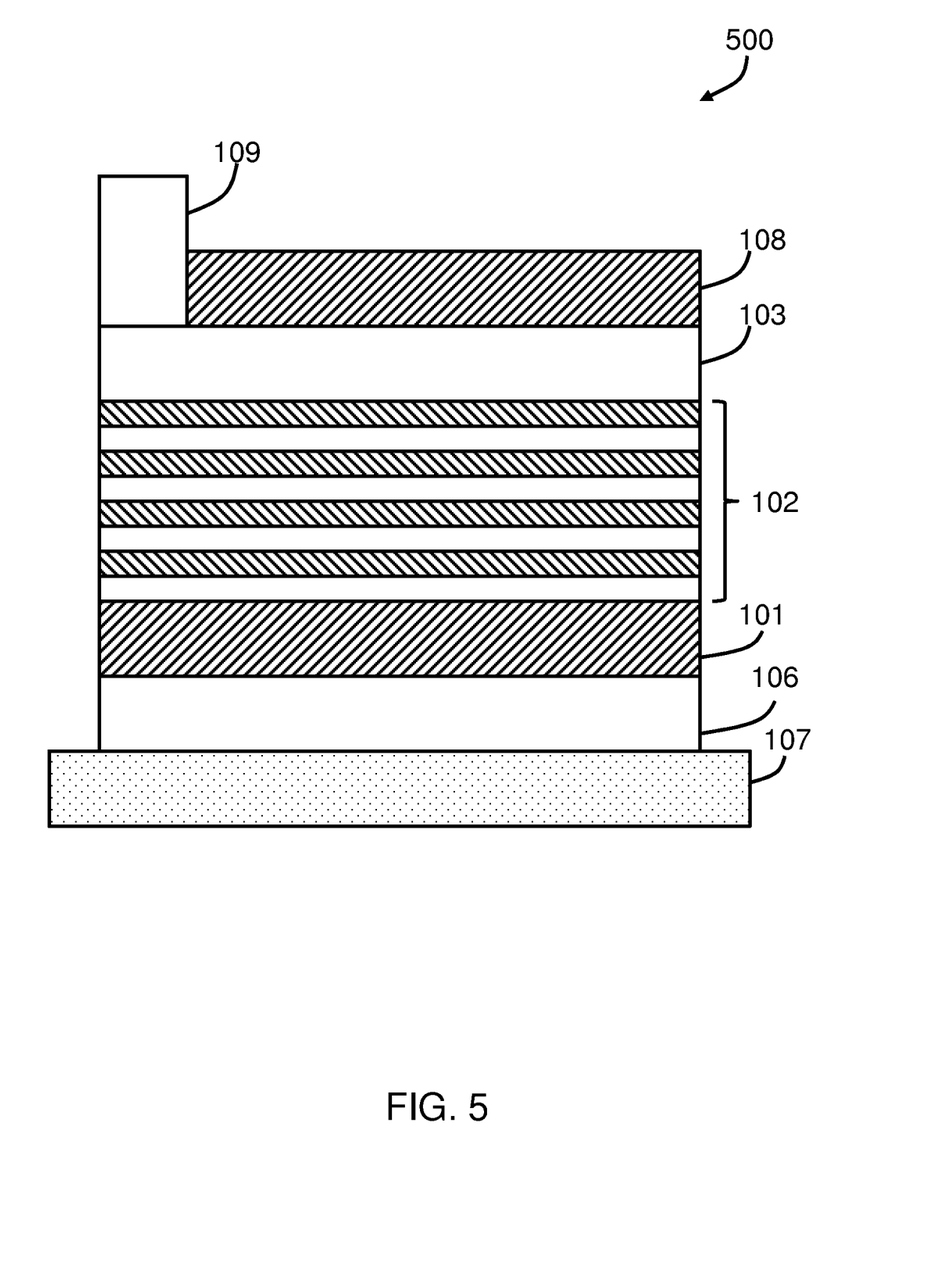
FIG. 5 illustrates an LED including a transparent tensile-stressing layer according to an embodiment of the invention.

FIG. 5 illustrates an LED device 500 including a transparent tensile-stressing layer 108 according to an embodiment of the invention. The transparent tensile-stressing layer 108 is formed on the second electrode layer 103 and permits the passage of light from the plurality of quantum wells 102 through the transparent tensile-stressing layer 108. In one embodiment, the tensile-stressing layer 108 is designed with a predetermined thickness and chemical composition to adjust the band-gap or energy barrier of the plurality of quantum wells 102. In other words, the tensile-stressing layer 106 and the transparent tensile stressing layer 108 may generate a combined compression stress in the plurality of quantum wells 102 that adjusts the band-gap or energy barrier of the plurality of quantum wells 102.

The transparent tensile-stressing layer 108 may be formed of any material capable of passing light from the plurality of quantum wells 102 to outside the LED device 500. Examples of transparent tensile-stressing layers 108 include transparent oxide layers or transparent nitride layers, such as transparent silicon oxide (SiO) and transparent silicon nitride ($SiN_x$). The transparent tensile-stressing layer 108 may be formed on the second electrode layer 103 by any process, including a PECVD process.

A metal electrical contact 109 is also formed on the second electrode layer 103. The metal electrical contact 109 extends through the transparent stressing layer 108 to provide an electrical contact for activating the LED device 500. The metal electrical contact 109 may be formed of any conductive metal material, such as aluminum, gold, platinum, palladium, or any combination of conductive metals.

While FIG. 5 illustrates an embodiment of the electrical device 500 including the transparent tensile-stressing layer 108, embodiments of the invention also include LED devices having the transparent tensile-stressing layer 108 omitted.

Figure 6:
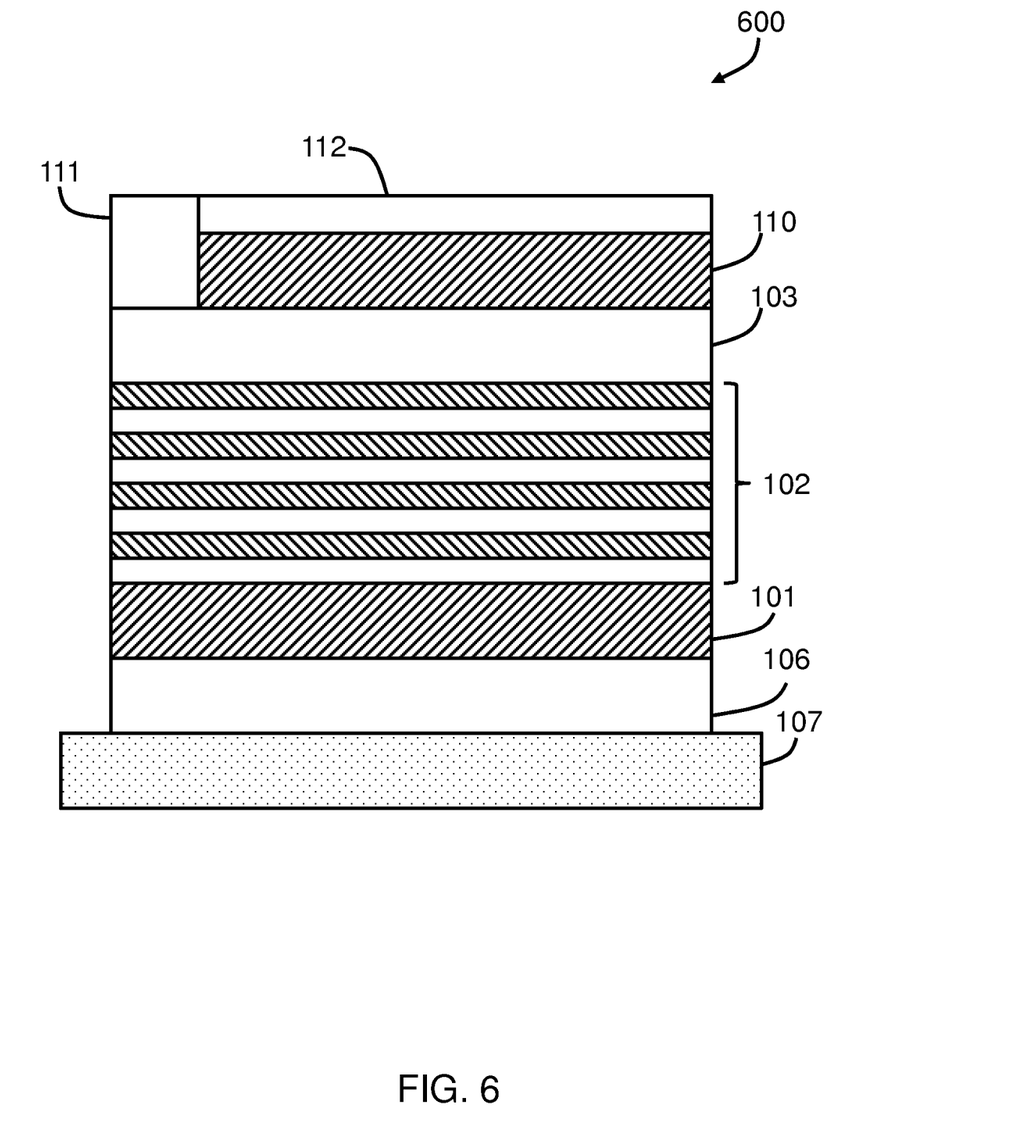
FIG. 6 illustrates an LED structure including a transparent tensile-stressing layer and a patterned electrical contact layer according to an embodiment of the invention.

FIG. 6 illustrates an LED device 600 including an electrical contact layer 112 according to an embodiment of the invention. In the embodiment illustrated in FIG. 6, the transparent tensile-stressing layer 108 is formed on the second electrode layer 103, as in FIG. 5. A metal electrical contact 111 is formed, similar to the metal electrical contact 109 of FIG. 5, and an electrical contact layer 112 is formed to electrically connect to the metal electrical contact 111.

Figure 7:
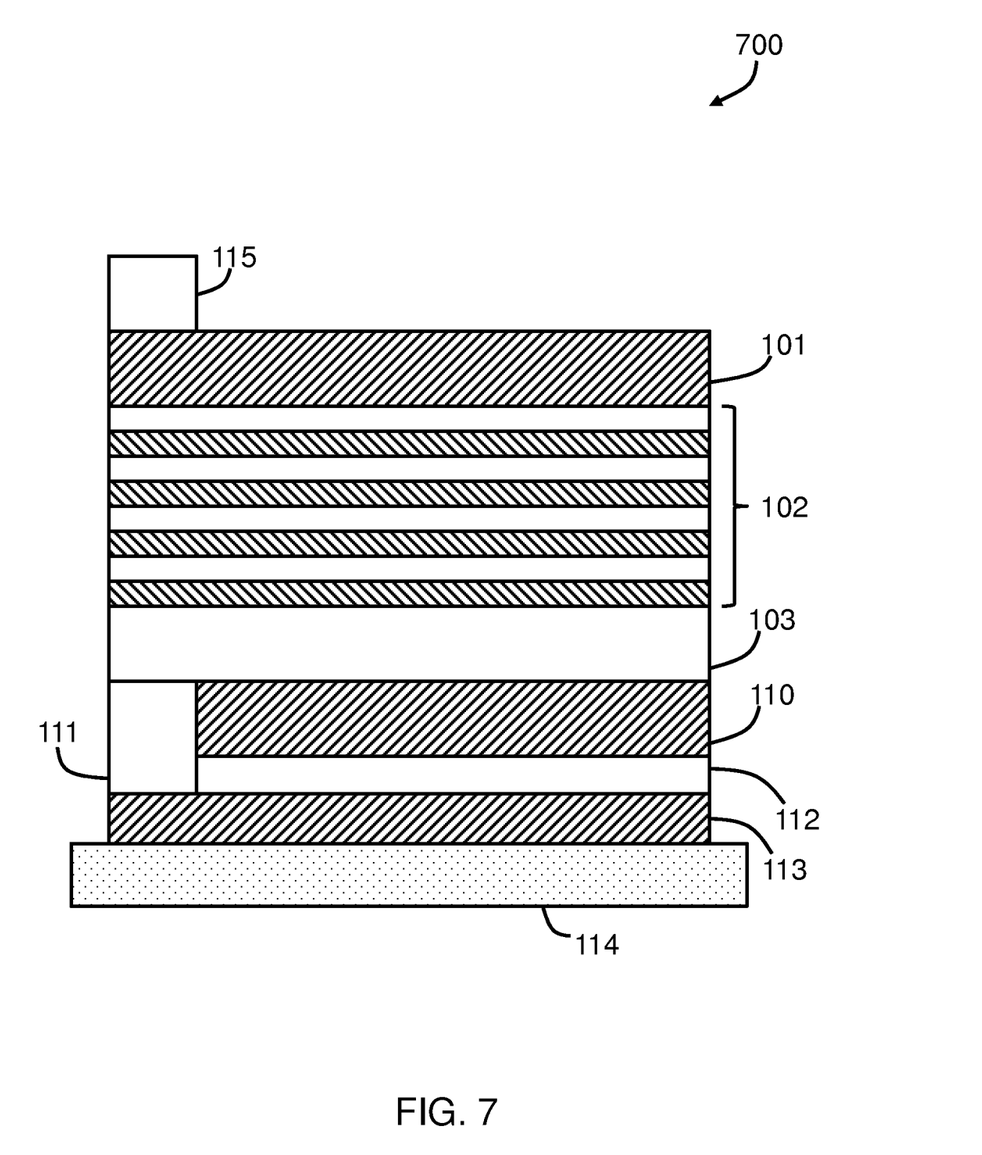
FIG. 7 illustrates an LED structure including a rigid substrate according to an embodiment of the invention.

In one embodiment, the electrical contact layer 112 is a continuous layer formed over the entire surface of the transparent tensile-stressing layer 110. As illustrated in FIG. 7, in such an embodiment, the LED device 600 is flipped, the electrical contact layer 112 is attached to a rigid substrate 114 via a bonding layer 113, and the tensile-stressing layer 106 and the flexible handle layer 107 are removed to form an LED device 700. In such an embodiment, one or both of the transparent tensile-stressing layer 110 and the electrical contact layer 112 may have a reflective characteristic to reflect light from the plurality of quantum wells 102.

A metal electrical contact 115 is formed on the first electrode layer 101. The metal electrical contact 115 may be formed of any conductive metal material, such as aluminum, gold, platinum, palladium, or any combination of conductive metals.

The material making up the rigid substrate 114 is selected to maintain the stress in the plurality of quantum wells 102 generated by the tensile-stressing layer 106, even after removal of the tensile-stressing layer 106. In this manner, the rigid substrate 114 "locks in" the stress of the tensile stressing layer 106. In some embodiments, additional elements and structures (not shown) are attached to the rigid substrate 114, such as cooling elements. In addition, the bonding conditions, such as bonding temperature and the type of the bonding substrate can be used to further adjust the resulting compressive stress applied to the quantum wells.

In one embodiment, the flexible handle layer 107 is a tape or other flexible material. In one embodiment, the flexible handle layer 107 is degradable by applying ultraviolet (UV) light to the flexible handle layer 107. In such an embodiment, the flexible handle layer 107 is removed by applying UV light to the flexible handle layer 107 and removing the layer by a water or chemical bath, or other cleaning process. The tensile-stressing layer 106 may be removed by any etching process, such as a chemical etching process.

While embodiments of the invention encompass LED devices configured to emit any desired wavelength, in one embodiment, the plurality of quantum wells 102 and the tensile-stressing layer 106 are together configured (e.g. by thickness, chemical composition, and stress levels) to generate a wavelength below 250 nanometers (nm). In another embodiment, the plurality of quantum wells 102, the tensile-stressing layer 106, and the transparent tensile-stressing layer 108 are together configured (e.g. by thickness, chemical composition, and stress levels) to generate a wavelength below 250 nm. In yet another embodiment, the plurality of quantum wells 102 and the rigid substrate 114 having locked in the stress from the tensile-stressing layer 106 are together configured (e.g. by thickness, chemical composition, and stress levels) to generate a wavelength below 250 nm.

In addition, while embodiments of the invention encompass tensile-stressing layers that are configured to induce any level of stress, in one embodiment, the tensile-stressing layer 106 is configured, by thickness and/or chemical composition, to generate a stress or pressure level between around 300 megapascals and around 2 gigapascals. In another embodiment, the tensile-stressing layer 106 and the transparent tensile-stressing layer 108 are together configured, by thickness and/or chemical composition, to generate a stress or pressure level between around 300 megapascals and around 2 gigapascals. In yet another embodiment, the rigid substrate 114 having locked in the stress from the tensile-stressing layer 106 is configured to generate a stress or pressure level between around 300 megapascals and around 2 gigapascals.

In addition, while particular embodiments have been illustrated including one or more of a tensile-stressing layer 106, a transparent tensile-stressing layer 108 and a rigid substrate 114, embodiments of the invention encompass devices including any combination of the tensile-stressing layer 106, the transparent tensile-stressing layer 108 and the rigid substrate 114 that generate predetermined stresses in the plurality of quantum wells 102 to adjust the band-gap or energy barrier of the plurality of quantum wells 102. Embodiments further encompass methods for fabricating such devices and systems and assemblies that incorporate the devices.

In addition, while the tensile-stressing layer 106 and the transparent tensile-stressing layer 108 may have any thickness according to a desired stress to be generated in the plurality of quantum wells 102, in one embodiment the thickness of one or both of the tensile-stressing layer 106 and the transparent tensile-stressing layer 108 is between around 5 micrometers and around 80 micrometers.

In embodiments of the invention, a thin-film LED structure has a band-gap that is adjusted using extrinsic stress from a tensile stressing layer. The tensile-stressing layer may also define a fracture line for spalling the thin-film LED structure from a host substrate in a spalling process.

In the figures, different layers are represented with different patterns, including dotted patterns and slanted-line patterns, and some layers have no distinguishing patterns. These patterns and non-patterns are provided only to distinguish one layer from the next, and do not indicate the use of any specific type of material. In other words, two layers having the same pattern are not necessarily made of the same material. The materials or classes of materials that make up the layers according to some embodiments have been disclosed above, and the patterns in the figures are not intended to supersede or contradict the detailed description, above.

While preferred embodiments have been described above, it will be understood that those skilled in the art, both now and in the future, may make various improvements and enhancements which fall within the scope of the claims which follow.

What is claimed is:

1. A light-emitting diode device, comprising:
   a base substrate including a plurality of quantum well layers, a first electrode on one side of the plurality of quantum well layers, and a second electrode on an opposite side of the plurality of quantum well layers; and
   a tensile-stressing layer formed on the base substrate and having a thickness and chemical composition configured to generate a first tensile stress in the base substrate, the first compressive stress selected to cause the base substrate to have a predetermined band-gap, wherein the tensile-stressing layer is a stress-inducing layer having a thickness and chemical composition configured to define a location of a fracture in a host substrate on which the base substrate is formed, the fracture formed in a spalling process.

2. The light-emitting diode device of claim 1, wherein the tensile-stressing layer is formed on the first electrode, the light-emitting diode device further comprising:
   a transparent tensile-stressing layer formed on the second electrode,
   wherein the tensile-stressing layer and the transparent tensile-stressing layer have a thickness and chemical composition such that the first compressive stress in the base substrate is generated by a combined tensile stress of the tensile-stressing layer and the transparent tensile-stressing layer.

3. The light-emitting diode device of claim 2, wherein the transparent tensile-stressing layer is formed of one of a transparent layer of silicon nitride and a transparent layer of silicon dioxide.

4. The light-emitting diode device of claim 1, further comprising:
   a metal electrical contact on the second electrode.

5. The light-emitting diode device of claim 1, wherein the tensile-stressing layer is a rigid substrate affixed to the base substrate to lock in a compression stress generated in the base substrate prior to affixing the rigid substrate to the base substrate.

6. The light-emitting diode device of claim 1, wherein the tensile-stressing layer is a rigid substrate affixed to the base substrate to lock in a compression stress generated in the base substrate by a metal tensile-stress-inducing layer,
   wherein the light-emitting diode device does not include the metal tensile-stress-inducing layer due to the metal tensile-stress-inducing layer having been removed from the base substrate, the rigid substrate configured to maintain the compression stress in the base substrate induced by the metal tensile-stress-inducing layer after removal of the metal tensile-stress-inducing layer from the base substrate.

7. The light-emitting diode device of claim 1, wherein the first and second electrodes are formed of gallium nitride.

8. The light-emitting diode device of claim 1, wherein the first level of tensile stress is between around 300 megapascal and around 2 gigapascal.

9. A light-emitting diode device, comprising:
   a base substrate including a plurality of quantum well layers, a first electrode on one side of the plurality of quantum well layers, and a second electrode on an opposite side of the plurality of quantum well layers;
   a tensile-stressing layer formed on the base substrate and having a thickness and chemical composition configured to generate a first tensile stress in the base substrate, the first compressive stress selected to cause the base substrate to have a predetermined band-gap; and
   a metal electrical contact on the second electrode, wherein the metal electrical contact includes a portion formed on a side of a transparent tensile-stressing layer formed opposite the second electrode.

\* \* \* \* \*